United States Patent
Cukauskas et al.

[19]

[11] Patent Number: 5,889,289
[45] Date of Patent: Mar. 30, 1999

[54] HIGH TEMPERATURE SUPERCONDUCTOR/ INSULATOR COMPOSITE THIN FILMS WITH JOSEPHSON COUPLED GRAINS

[75] Inventors: Edward J. Cukauskas, Vienna, Va.; Laura H. Allen, Bowie, Md.

[73] Assignee: The United States of America as represented by the Secretary of the Navy, Washington, D.C.

[21] Appl. No.: 919,346

[22] Filed: Aug. 28, 1997

[51] Int. Cl.$^6$ .................................................... H01L 29/06
[52] U.S. Cl. ............................ 257/33; 257/34; 505/190
[58] Field of Search ............................ 257/31, 32, 33, 257/34, 35; 505/190, 702, 816, 817

[56] References Cited

U.S. PATENT DOCUMENTS

| | | | |
|---|---|---|---|
| 4,025,844 | 5/1977 | Deutshcer | 324/43 R |
| 5,667,650 | 9/1997 | Face et al. | 204/298.07 |
| 5,736,489 | 4/1998 | Kozlowski | 505/239 |

OTHER PUBLICATIONS

Cukauskas, E.J. and Allen L.H., "Off–Axis Co–Sputtered YBCO and Ce$_2$O Thin Films" Abstract distributed at 1996 Applied Superconductivity Conference, Pittsburg, PA Aug. 25–30, 1996.

Cukauskas, E.J. and Allen L.H., "$Y_1Ba_2Cu_3O_{7-x}$ and LaAlO$_3$ Composite Thin Films by Off–Axis Magnetron Sputtering" Appl. Phys. Lett. 60(3), 20 Jan. 1992, pp. 389–391.

*Primary Examiner*—Sara Crane
*Attorney, Agent, or Firm*—Thomas E. McDonnell; Ralph T. Webb

[57] ABSTRACT

High temperature superconductor composite thin film devices with easily moved Josephson vortices are described having high $T_c$ and good magnetic vortex properties. A preferred composite material was YBCO/CeO$_2$ thin film on a MgO substrate. The superconductor composites were preferably formed by off-axis co-sputtering. A surprising recovery in properties was seen after plasma etching with oxygen.

22 Claims, 2 Drawing Sheets

HIGH TEMPERATURE SUPERCONDUCTOR/INSULATOR COMPOSITE THIN FILMS WITH JOSEPHSON COUPLED GRAINS

BACKGROUND OF THE INVENTION

1. Field of the Invention

The present invention relates to a superconductive high temperature composite thin film material and a method of preparation wherein the composite material has interspersed superconductor and insulator grains. The superconductive composite thin film material has a predetermined critical current density, a high critical temperature and easily moved Josephson vortices. The critical current density is determined by the relative amounts of high temperature superconductor and insulator. The invention particularly relates to a composite film of a superconductor such as $YBa_2Cu_3O_7$ (YBCO), $TlCa_2Ba_2Cu_3O_8$, $Bi_2(Sr,Ca)_3Cu_2O_8$, $La_{2-x}Sr_xCuO_4$ or other rare earth barium copper oxide superconductors and one or more non-diffusing insulators such as cerium oxide, ($CeO_2$), magnesium oxide (MgO), $LaAlO_3$ or $SrTiO_3$ deposited on a substrate that is compatible with the high temperature superconductor and with the superconductive high temperature composite material having easily moved Josephson vortices.

2. Description of the Related Art

There is considerable interest in high transition temperature superconducting devices and high temperature superconducting electronics research focusing on the development of active three-terminal devices having gain. See J. E. Nordman, Semiconductor Science and Technology, 8, 681 (1995); R. Gerdemann, L. Alff, A. Beck, O. M. Froelich, B. Mayer and R. Gross, IEEE Transactions in Applied Superconductivity 5, 3292 (1995); Y. M. Zhang, D. Winkler, P. A. Nilsson, and T. Claeson, Applied Physics Letters, 64 1153 (1994); and K. Miyahara, S. Kubo, and M. Suzuki, Journal of Applied Physics 76, 4772 (1994), all herein incorporated by reference. The vortex flow transistor reported by J. S. Martens. G. K. G. Hohenwarter, J. B. Beyer, J. E. Nordman and D. S. Ginley, J. Appl. Phys. 65, 4057 (1989), herein incorporated by reference, the fluxonic junction transistor proposed by A. M. Kadin, J. Appl. Physics 68, 5741(1990) herein incorporated by reference and the long Josephson junction biased in the flux flow mode reported by D. P. McGinnis, J. E. Nordman and J. B. Beyer, IEEE Trans, Magn. MAG-23, 699 (1987), herein incorporated by reference, are examples of devices whose gain effect is dependent on the control of magnetic vortices in the device. The first two devices rely on the movement of Abrikosov vortices in a thin superconducting film while the third device uses the motion of Josephson vortices along the length of a tunnel junction. The long hysteretic Josephson junction vortex flow device has only been reported using low transition temperature ($T_c$) electrode materials. However, Gerdemann et al. have reported fabricating arrays of parallel bicrystal grain boundary junctions into high $T_c$ vortex flow transistors. Single-layer vortex flow devices require a region of easily moved vortices for controlling the transport with a small external magnetic field. Vortex motion can be realized in a device by incorporating an array of weak links into the structure or by the use of a grain boundary Josephson junction.

The successful development of three-terminal high temperature superconducting devices having gain can have a significant impact on the viability of superconducting electronics. The superconducting vortex flow transistor has been demonstrated in both low $T_c$ and high temperature superconductive materials. The superconducting vortex flow transistor's speed and frequency response is dependent on the material properties and kind of vortices (Abrikosov or Josephson) responsible for vortex transport. Other superconducting flux flow and fluxonic devices include those of Hohenwater et al., *Characteristics of superconducting fluxflow transistors*, IEEE Trans. Magn., vol. 27, pp. 3297–3300 (March 1991), herein incorporated by reference. See also Kadin, *Duality and fluxonics in superconducting devices*, J. Appl. Phys., vol. 68, pp. 5741–5749 (December 1990), herein incorporated by reference. These devices are based on the motion of either Abrikosov or Josephson vortices and require a material with properties which do not substantially impede the flow of magnetic flux. The high pinning strength of $YBa_2Cu_3O_7$ (YBCO) has made it unsuitable for flux flow devices without modifying the YBCO in some manner such as thinning or taking advantage of naturally occurring defects such as the grain boundary junction formed over a substrate step. See Martens et al., *S-parameter measurements on single superconducting thin-film three-terminal devices made of high $T_c$ and low $T_c$ materials*, J. Appl. Phys., vol. 65, pp. 4057–4060 (May 1989), herein incorporated by reference. See also Martens et al., *Fluxflow microelectronics*, IEEE Trans. Appl. Super., vol. 3, pp. 2295–2302 (March 1993), herein incorporated by reference.

Researchers have sought practical, three terminal, superconducting devices for applications in hybrid technologies and on-chip integration with passive, superconducting components. Such devices included the flux-flow transistor and the fluxonic junction transistor, both of which require a superconducting material in which vortices can easily move.

High quality high temperature superconductor (HTS) thin films having "easily movable vortices" are difficult to fabricate. High quality thin films of YBCO generally have $T_c$'s approaching 90 K (degrees Kelvin) and $J_c$'s at 77 K greater than $1 \times 10^6$ $A/cm^2$ and show strong vortex pinning. In such materials, vortex motion is difficult except very close to $T_c$ or in very high magnetic fields (10's of Tesla). See Rose-Innes et al., *Introduction to Superconductivity, 2nd Edition*, International Series in Solid State Physics, Vol. 6, Pergamon Press, New York, at pp. 186–190 (1978), herein incorporated by reference.

Materials having easy vortex motion usually have a reduced $T_c$ and $J_c$ and are chemically unstable in the ambient environment. This is because the material within or at the grain boundaries often consists of impurities or off-stoichiometric material, causing a reduced $T_c$, $J_c$ and chemical stability. For example, oxygen-deficient YBCO films which have reduced $T_c$'s and $J_c$'s as well as weak pinning have been shown to be very susceptible to damage from device processing and exposure to water-based chemicals. See L H. Allen et al., *Thin film composites of Au and $YBa_2Cu_2O_{-\delta}$*, Appl. Phys. Lett., vol. 66(8), pp. 1003–1005 (20 Feb., 1995), herein incorporated by reference. Once these materials are fabricated into vortex flow devices, they degrade and change their operating characteristics with age.

Even materials that were initially high quality are susceptible to processing damage. For example, weak-link microbridges fabricated from high-quality materials have exhibited easy vortex motion. However, when made and used in flux flow devices, they are often operated at reduced temperatures because the $T_c$ of the microbridge is degraded by the patterning process. See Miyahara et al., *Vortex Flow Characteristics of High-$T_c$ Flux Flow Transistors*, J. Appl. Phys., vol 75, pp. 404 (1994), herein incorporated by reference. Furthermore, the stability with time of these devices is uncertain because of the inherent chemical instability associated with degraded superconducting material.

SUMMARY OF THE INVENTION

It is therefore an object of the present invention to provide a composite thin film that consists of a random array of Josephson coupled grains in which Josephson vortices can easily move throughout the composite film and with the composite consisting of a random array of superconducting grains separated from one another by insulating grains.

A principal object of the present invention is to provide a composite thin film that consists of a random array of Josephson coupled grains in which Josephson vortices can easily move throughout the composite film, where $T_c$ is inversely related to the intergranular coupling strength.

The invention further comprises composite thin films that are chemically stable and a process for making these composite thin films.

Yet another object of the present invention is to provide a composite thin film that consists of a random array of Josephson coupled grains in which Josephson vortices can easily move throughout the composite material and wherein the film "as-grown" will have the desired property of easy flux motion.

Still further object of the invention is to provide a composite thin film whose superconductive properties can be recovered by further processing steps after fabrication of a device.

It is therefore still another object of the present invention to provide a composite thin film material that consists of a random array of Josephson coupled grains in which Josephson vortices can easily move throughout the composite film, wherein the composite film can be incorporated into a fluxonic junction diode.

It is therefore another object of the present invention to provide a composite thin film that consists of a random array of Josephson coupled grains in which Josephson vortices can easily move throughout the composite film, wherein the composite material can be incorporated into a vortex flow transistor.

It is therefore another object of the present invention to provide a composite thin film that consists of a random array of Josephson coupled grains in which Josephson vortices can easily move throughout the composite film wherein the composite material can be incorporated into a Josephson junction transistor.

It is therefore another object of the present invention to provide a composite thin film that consists of a random array of Josephson junctions in which Josephson vortices can easily move throughout the composite film wherein the composite film can be incorporated into a bolometric device.

These and other objects are accomplished by forming a composite material comprising a thin film of a high temperature superconductor material on a stable substrate wherein said superconductor comprises grains of a high temperature superconductor separated by a non-superconducting material that does not interact with the high temperature superconductor.

These composite thin films can be formed by conventional techniques including chemical vapor deposition, pulsed laser deposition, and off-axis co-sputtered deposition.

BRIEF DESCRIPTION OF THE DRAWINGS

A more complete appreciation of the present invention and several of the accompanying advantages thereof will be readily obtained by reference to the following detailed description and accompanying drawings, wherein.

DETAILED DESCRIPTION OF THE INVENTION

Figure 1:
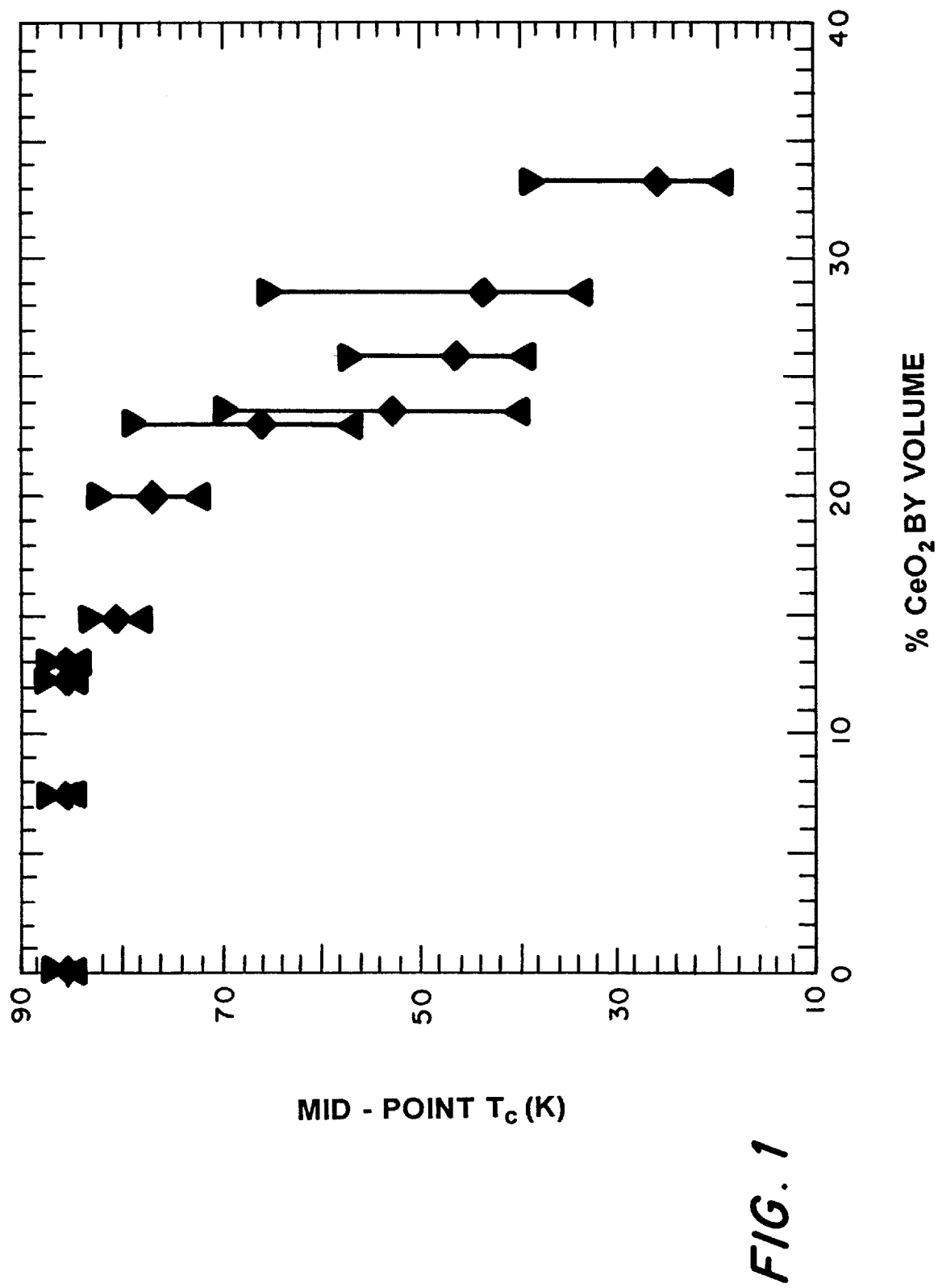
FIG. 1 is a plot of the mid-point $T_c$ in K versus the % $CeO_2$ by volume. The figure shows the decrease in $T_c$ as the volume of $CeO_2$ increases. The bars show $\Delta T_c$, the width of the resistive transition for each value of $CeO_2$.

The following detailed description of the invention is provided to aid those skilled in the art in practicing the invention. However, the following detailed description of the invention should not be construed to unduly limit the present invention which is limited by the claims and applicable law. Variation and modification in the embodiments described below may be made by those of ordinary skill in the art without departing from the scope of the present invention.

The term "composite" is used herein to describe a thin film material system comprising at least two distinct materials interspersed within each other forming a two-dimensional array of the two different kinds of materials. The term "composite" additionally describes a thin film material system wherein a grain of one material is coated or encapsulated by a different material so as to form an inclusion of non-superconductive material along the grain boundaries of the superconductor.

The term "device" is used herein to describe an element of a circuit, for example a vortex flow transistor, fluxonic junction diode, Josephson junction transistor, capacitors, resistors and interconnecting lines to form a circuit. These circuits can then be patterned into superconducting chips as is well known in the art.

With respect to superconducting materials, the $T_c$ is the critical temperature of a material below which temperature the superconducting material exhibits no measurable voltage during current flow. In addition, a superconducting material also has a $J_c$ which is the critical current density. If a current is passed through a sample of superconducting material and if the current is above $I_c$ (the critical current), then the superconducting sample exhibits a measurable voltage due to current flow. The value of $J_c$ is proportional to the value of $I_c$ ($J_c=I_c$/cross-sectional area of current flow). The lower the value of $J_c$ the lower the value of $I_c$ and, therefore, the lower the threshold current that is required for voltage development, (vortex movement).

The purpose of this invention is the fabrication of thin film high temperature superconductors (HTS) with the important material property of "easily moved" magnetic vortices. This property may be associated with material systems having a reduced critical current density resulting from reduced intergranular coupling. For example, composite thin film material systems of a high temperature superconductor such as YBCO and a non-diffusing insulator such as $CeO_2$ exhibit this property. For low $CeO_2$ concentrations the superconducting onset temperature is not significantly reduced in these composite material films, suggesting that the $CeO_2$ insulator is segregated into the grain boundaries and this forms a Josephson-junction-like structure wherein the superconducting grains are coupled. This intergranular coupling can be either SNS or SIS, wherein S is a superconductor, N is a normal metal and I is an insulator. In the examples given herein the $CeO_2$ is the "N" or "I" portion of the junction and the YBCO is the "S" portion of the junction.

The thin film composite materials can be fabricated into devices using conventional fabrication techniques including photolithography followed by chemical etching, ion milling, laser ablation and ion beam techniques. These composite material films are usable as materials for fabricating three terminal HTS devices which rely on vortex interactions for the control of electron transport. These composite material films also have application as non-linear superconducting devices, bolometers, and non-bolometric photodetectors.

The high temperature superconductors are paired with insulators that will not diffuse into the lattice of the superconductor and destroy the superconducting properties thereby lowering the $T_c$. Examples of superconductor/insulator pairs include $YBa_2Cu_3O_7/CeO_2$; $YBa_2Cu_3O_7/MgO$; Y $Ba_2Cu_3O_7/LaAlO_3$; $YBa_2Cu_3O_7/SrTiO_3$; $Bi_2(Ca, Sr)_3Cu_2O_8/CeO_2$; $Bi_2(Ca,Sr)_3Cu_2O_8/MgO$; $Bi_2(Ca,Sr)_3Cu_2O_8/LaAlO_3$; $Bi_2(Ca,Sr)_3Cu_2O_8/SrTiO_3$; $La_{2-x}Sr_xCuO_4/CeO_2$; $La_{2-x}Sr_xCuO_4/MgO$; $La_{2-x}Sr_xCuO_4/LaAlO_3$; $La_{2-x}Sr_xCuO_4/SrTiO_3$; $TlCa_2Ba_2Cu_3O_9/CeO_2$; $TlCa_2Ba_2Cu_3O_9/MgO$; $TlCa_2Ba_2Cu_3O_9/LaAlO_3$ and $TlCa_2Ba_2Cu_3O_9/SrTiO_3$. When YBCO or other rare earth barium copper oxide high temperature superconductors having the formula $ABa_2Cu_3O_{7-\Delta}$ wherein $\Delta$ is between 0 and about 0.5 and A is selected from the rare earth materials generally recognized as superconducting including lutetium (Lu), Neodinium (Nd), Samarium (Sm), Europium (Eu), Gadolinium (Gd), Erbium (Er), Holmium (Ho), and Ytterbium (Yb). When the $ABi_2Cu_3O_{7-\Delta}$ and YBCO are used these compounds are in the superconducting orthorombic crystal form. See Quadri et al. U.S. Pat. No. 5,106,829 herein incorporated by reference.

Preferred insulators are single metal oxides such as MgO and $CeO_2$ because the single metal oxides are easier to maintain stoichiometry during deposition. A problem with a mixed metal oxide such as $SrTiO_3$ and $LaAlO_3$ is that it is difficult to maintain the mixed oxide stoichiometry as the material is deposited.

The substrate can be any conventional substrate material suitable for high temperature superconductive film growth and includes $SrTiO_3$ (STO), MgO, $SrLaAlO_4$, $SrLaGaO_4$, YSZ (yttria stabilized $ZrO_2$), $LaAlO_3$, $NdGaO_3$, and both Si and $Al_2O_3$ provided that Si and $Al_2O_3$ have a buffer layer to prevent diffusion of the substrate into the high temperature superconductor which would destroy the properties of the high temperature superconductor.

A preferred high temperature superconductor/ insulator composition is $YBCO/CeO_2$. YBCO is preferred as a high temperature superconductor because of its good superconducting properties, morphology and ease of film synthesis, and $CeO_2$ is preferred as the insulator because it is immiscible with YBCO and a single metal oxide is easier to maintain stoichiometry during deposition. The concentration of $CeO_2$ in the composite thin film will determine the $T_c$ and $J_c$ in the composite material and in general concentrations above about 43% by volume $CeO_2$ in the film are insulating. Therefor one will want up to about 43% by volume $CeO_2$ in the film and a preferable concentration is up to about 30% by volume $CeO_2$ in the film:

The high temperature superconductor/insulator pairs can be readily formed by a variety of different methods. Methods for the deposition of the superconductor include sputtering, evaporation, laser ablation, and chemical vapor deposition. Sputtering may be conventional or off-axis sputtering. Evaporation may be thermal evaporation or electron beam evaporation. Chemical vapor deposition may be metalorganic chemical vapor deposition (MOCVD). Other methods of co-depositing a high temperature superconductor and insulator are known in the art and any in-situ deposition techniques are acceptable for the fabrication of the composite film. As previously stated, the substrate includes $SrTiO_3$ (STO), MgO, $SrLaAlO_4$, $SrLaGaO_4$, YSZ (yttria stabilized $ZrO_2$) $LaAlO_4$, $NdGaO_3$ and both Si and $Al_2O_3$ with buffer layers. Deposition of the superconductor and insulator is carried out at an appropriate temperature wherein the substrate, superconductor and insulator are stable at the deposition temperature and where the superconductor and insulator form a composite materials system.

A preferred deposition technique is off-axis magnetron sputtering using a three gun off-axis sputtering chamber as described in $YBa_2CuO_{-x}$ and $LaAlO_3$ Composite Thin Films by Off-Axis Magnetron Sputtering, Appl. Phys. Lett. 60 (3) pp 384–391 (1992) herein incorporated by reference.

The plasma etch step is very important in recovering the high temperature superconducting properties and Josephson coupled grain properties of the composite material. Often a composite with a high percentage of insulator will be non-superconducting but when treated with oxygen the material will become superconductive. In addition the composite will become non-superconductive or the $T_c$ of the composite will decrease after the composite is formed into a device. When the composite device is subjected to oxygen plasma etch the $T_c$ is restored and the Josephson coupled grain properties are improved. The plasma oxygen pressure can be raised to about 5 mm of Hg and a preferred plasma oxygen pressure is from about 0.1 mm Hg to about 5 mm Hg.

The invention having been generally described, the following example is given as particular embodiments of the invention to demonstrate the practice and advantages thereof. It is understood that the example is given by way of illustration and is not intended to limit in any manner the specification or the claims that follow.

$YBa_2CuO_7/CeO_2$ composites have been made by co-sputtering YBCO and $CeO_2$ onto a (100) MgO substrate. These $YBCO/CeO_2$ composites were described in The Properties of Co-sputtered $YBa_2Cu_2O$- and $CeO_2$ Thin Films, E. J. Cukauskas and L. H. Allen, J. Appl. Phys. 80 (10), 15 Nov., 1996, pp 5843–5849 herein incorporated by reference and Off-Axis Co-Sputtered YBCO and $CeO_2$ Thin Film, E. J. Cukauskas et al., IEEE Transactions on Applied Superconductivity, vol. 7 June 1997 pp 1654–1657, herein incorporated by reference. The $YBCO/CeO_2$ composites were generally made by depositing the $YBCO/CeO_2$ onto a (100) MgO substrate using a multi-target off-axis sputtering system. The face to face YBCO targets were presputtered at 0.45 A dc and the $CeO_2$ target was presputtered at the appropriate rf power level for the desired composition. Composition was calculated from the YBCO and $CeO_2$ deposition rate and time. The YBCO and $CeO_2$ were co-sputtered for about 4 hours which resulted in a film thickness ranging from about 1600 to 2800 Å. The resulting film was cooled to ambient temperature in one atmosphere of $O_2$. Upon removal from the sputtering chamber, silver contact pads were thermally evaporated through a metal shadow mask prior to sample characterization. A series of $YBCO/CeO_2$ films were co-sputtered using these conditions, each at a different $CeO_2$ rf power level. This yielded films having a $CeO_2$ concentration from 0% to 43% by volume for rf power levels up to 150 W. Films made with $CeO_2$ concentrations above about 43% were insulating.

The as-sputtered samples (with silver pads added) were characterized for room-temperature resistance ($R_{300 K}$), $T_c$, transition width ($\Delta T_c$), and resistance ratio (RR). $T_c$ was defined as the temperature at which the sample resistance became less than 1 m$\Omega$, $\Delta T_c$ as the temperature interval between the 10 and 90% resistance points just below the transition onset, and RR as the ratio of the resistance at 295K and 100K. The $T_c$ of the as-sputtered films decreased and the transition width increased as more $CeO_2$ was incorporated into the films as can be readily seen in FIG. 1. These observations are consistent with a random de-coupling of the superconducting grains as the $CeO_2$ is increased, producing a range of $T_c$ that results in a broadened transition. As-sputtered films with more than about 23% $CeO_2$ by volume were non-superconducting, but surprisingly, some of these samples became superconducting when subjected to an oxygen plasma etch. The oxygen plasma etch process will be discussed in more detail below. Table I summarizes the properties of the as-sputtered films. $T_c$ rapidly falls off above approximately 13% $CeO_2$, and $R_{300\ K}$ rises sharply at about 30% $CeO_2$. After characterization, the films were then scribed into a bridge geometry for critical current measurements and magnetic field response studies. With the methods described above one can form $YBCO/CeO_2$ composites with up to about 43% by volume $CeO_2$. Preferably the high temperature superconductor contains up to about 30% by volume $CeO_2$. Superconductor composites were made that had $dI_c/dB$ values greater than about a 2% change in critical current per gauss, a value that is suitable for forming three terminal flux flow devices.

Standard photolithography and wet chemical etching were initially used to define bridges in some of the first $YBCO/CeO_2$ samples. A substantial degradation in $T_c$ and an increase in resistance was found after this processing and some samples became non-superconducting after the processing. To avoid this degradation, samples were patterned by mechanically scribing the films into bridges one or two mm wide. The bridge length of these samples was uncertain, and no attempt was made to estimate it. These samples were intended for investigating the temperature dependence of the critical current ($I_c$) near $T_c$.

To study further the film dependence on processing, a 15% $CeO_2$ sample was patterned with photoresist and ion milled into a 1-mm-wide bridge and afterwards subjected to an oxygen plasma etch for 20 min in a barrel plasma etcher. It was surprisingly learned that $T_c$ measurements after the oxygen plasma etch showed a significant improvement in $T_c$ and a reduction in resistance over the values measured prior to the etch. The as-sputtered film $T_c$ was 68.3K, and after ion milling had degraded to 51.3K. However, after plasma etching the bridge in oxygen, $T_c$ increased to 75.0° K and $R_{300\ K}$ changed from 198 to 60.7 ω. In view of these results, all the scribed samples were routinely subjected to the oxygen plasma etch process before $I_c$ measurements. By using conventional photolithography, conventional patterning methods such as ion milling and wet chemistry, and rejuvenating the films with an oxygen plasma etch, it is now possible to fabricate these high temperature superconductor composite thin films into devices.

The oxygen plasma etching was performed on all the samples after bridge patterning and on those as-sputtered films which were not superconducting. A barrel plasma etcher, model #PMO 123, manufactured by Tegal Corp., Novato, Calif. was used for the treatment. The plasma etch was performed at a pressure of 1.2 mm of oxygen and rf power level set at 40% of maximum. Samples were etched for 20 minutes following a 30 minute system break-in period. However oxygen plasma pressures up to about 5 mm Hg can be used with a preferred range of oxygen pressures from about 0.1 mm to about 5 mm Hg. New contact pads had to be evaporated because the silver became discontinuous after the oxygen plasma etch. SEM micrographs showed that the silver formed an array of spiral-shaped columnar grains several thousand Å in diameter. Following the treatment, the films maintained their improved properties for at least several months.

TABLE 1

Summary of the properties of the as-sputtered (before) and oxygen plasma etched (after) $YBCO/CeO_2$ films and bridges.

| % vol $CeO_2$ | rf (W) | $R_{300°\ K.}$ (Ω) | $RR_{before}$ | $RR_{after}$ | $T_c$ (K)$_{before}$ | $T_c$ (K)$_{after}$ | $\Delta T_c$ (K)$_{before}$ | $\Delta T_c$ (K)$_{after}$ |
|---|---|---|---|---|---|---|---|---|
| 0 | 0 | 3.48 | 2.5 | 2.7 | 84.4 | 84.5 | 1.2 | 1.4 |
| 7.4 | 16 | 4.20 | 2.5 | 2.7 | 80.8 | 84.4 | 1.6 | 1.3 |
| 13.0 | 30 | 5.57 | 2.0 | 2.2 | 77.7 | 82.3 | 3.4 | 2.8 |
| 14.9 | 35 | 9.37 | 1.8 | 2.0 | 68.2 | 81.8 | 8.2 | 2.9 |
| 20.0 | 50 | 13.1 | 1.6 | 1.8 | 59.2 | 75.0 | 16.0 | 5.7 |
| 21.6 | 55 | 19.1 | 1.2 | 1.8 | — | 66.8 | — | 10.5 |
| 23.1 | 60 | 15.9 | 1.4 | 1.5 | 22.3 | 51.1 | 39.5 | 28.6 |
| 25.9 | 70 | 32.7 | 1.1 | 1.4 | — | 35.4 | — | 29.5 |
| 33.3 | 100 | 71.6 | 0.84 | 1.2 | — | 22.8 | — | 33.8 |
| 34.4 | 105 | 365 | — | 1.1 | — | 16.5 | — | 19.1 |
| 35.5 | 110 | 1.83k | — | 0.81 | — | — | — | — |
| 38.5 | 125 | 163k | — | 0.71 | — | — | — | — |
| 42.9 | 150 | 3.4M | — | — | — | — | — | — |

The oxygen plasma etched samples were characterized by $T_c$, $\Delta T_c$, RR, $R_{300\ K}$, $I_c(T)$ near $T_c$, and response to small applied magnetic fields. $I_c$ was taken as that value of current (~0.1 μV) which showed a clear departure from the voltage noise fluctuations. The bridges were scribed to approximate dimensions. Lengths were not precisely measured so that an electric field criterion was not used to define $I_c$. Significant improvements in the superconducting properties after the oxygen plasma treatment were seen.

Figure 2:
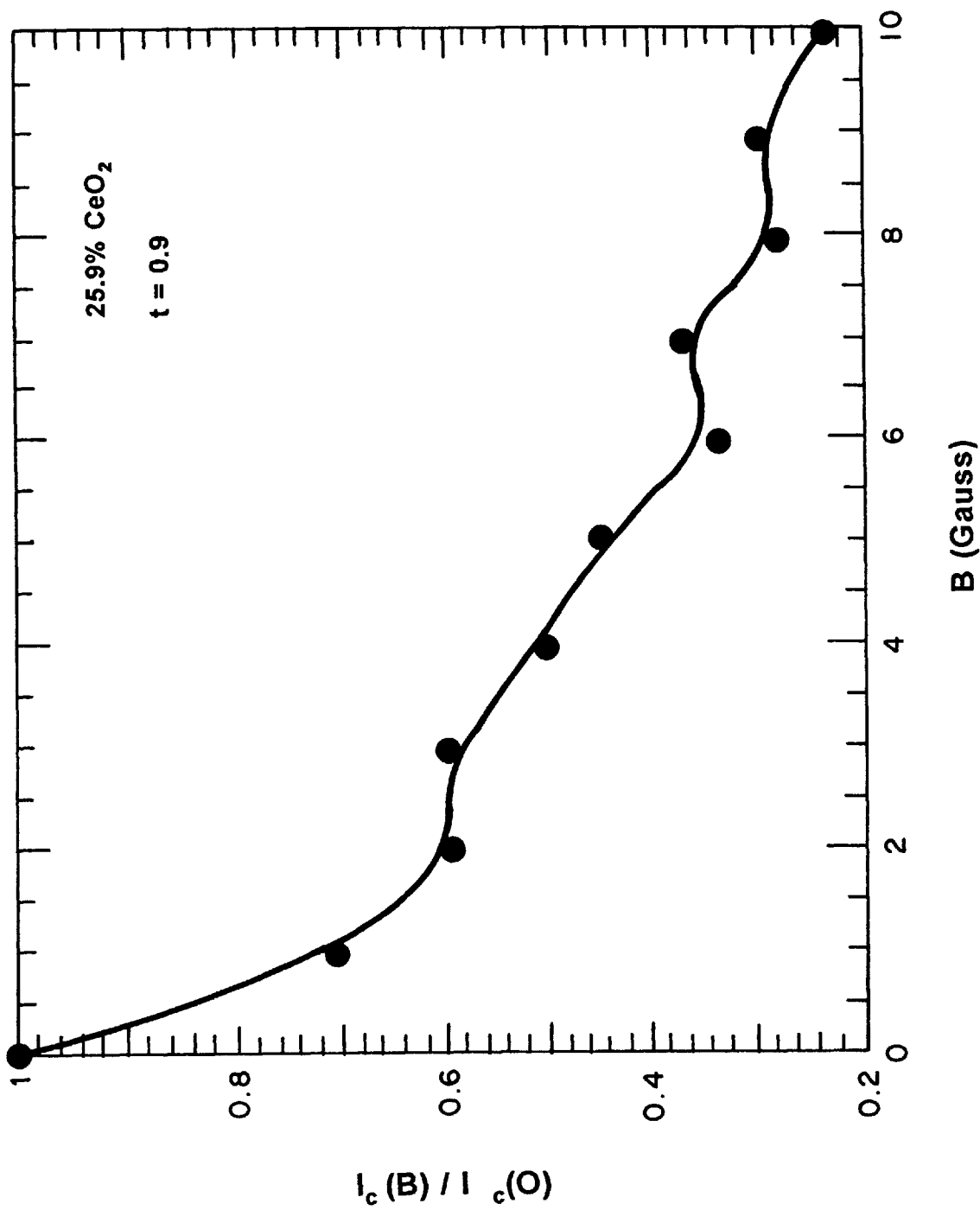
FIG. 2 is a plot of the magnetic field dependence of $I_c$ at a reduced temperature of 0.9 for a 25.9% by volume $CeO_2$ bridge.

A series of $I_c$ measurements were taken for each sample at fixed temperatures for several values of the applied magnetic field, one of which is shown in FIG. 2. If the field response is a result of Josephson vortices, then the response should be greater at lower fields where the sin (x)/x function of $I_c(B)$ in a junction varies the most, as is shown by the data of FIG. 2. The sensitivity of $I_c$ for small fields of several Gauss was also studied. The observed reduction of $I_c$ measured as a function of small magnetic fields supports transport by Josephson vortex motion.

Detailed Synthesis of the $YBCO/CeO_2$ Films

The $YBCO/CeO_2$ films were co-sputtered onto (100) MgO substrates using a multi-target off-axis sputtering chamber. The details of the chamber have been described in *YBa$_2$CuO-$_x$ and LaAlO$_3$ Composite Thin Films by Off-Axis Magnetron Sputtering*, Appl. Phys. Lett. 60 (3) pp 384–391 (1992) herein incorporated by reference. The MgO substrates were polished on one side and came from the manufacturer coated with mineral oil to keep out moisture. The substrates were thoroughly cleaned in trichlorethane, methanol and isopropanol after which they were subjected to a 40 h bake at 1000° C. in flowing oxygen. The extended bake was undertaken to assure all trace hydrocarbons and water contamination were removed. The substrates were pasted onto a stainless steel substrate holder using "Leitsilber 200" silver paint from Ted Pella, Inc., P.O. Box 492477 Redding Calif. 96049. They were then baked on a hot plate at 120° C. for one hour prior to loading into the vacuum chamber and left in one atmosphere of oxygen until ready for film growth. The deposition sequence began with the chamber evacuation and substrate holder heating to the deposition temperature of 680° C. in the flowing deposition gases. The sputter gas flow rates were set to 54 sccm (standard cubic centimeters per minute) for argon, 34 sccm for oxygen, and 11 sccm for hydrogen. After 10 minutes of gas flow, the turbomolecular pump was throttled back and the chamber pressure set to 150 μm for film deposition. At this point, the targets were pre-sputtered for 30 minutes at 0.45 A dc for the face-to-face YBCO targets and the CeO$_2$ target at the appropriate rf power level for the desired composition. Composition was calculated from YBCO and CeO$_2$ deposition rates and time. The shutter was then opened and the YBCO and CeO$_2$ were co-sputtered for 4 hours which resulted in a film thickness ranging from approximately 1600 to 2800 Å. The resulting film was cooled to ambient temperature in one atmosphere of oxygen. Upon removal from the sputtering chamber, silver contact pads were thermally evaporated through a shadow metal mask prior to sample characterization. A series of YBCO/CeO$_2$ films was co-sputtered using these conditions each at a different CeO$_2$ rf power level. This yielded films having CeO$_2$ concentrations from 0% to 43% by volume for rf power levels up to 150 W.

Although certain presently preferred embodiments of the present invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by the appended claims and the applicable rules of law.

What is claimed is:

1. A high temperature superconductor composite thin film device having easy vortex flow, said device being formed from the process comprising selecting a high temperature superconductor;

selecting an insulator;

selecting a substrate that is compatible with said high temperature superconductor;

co-depositing the high temperature superconductor and insulator on the substrate thereby forming a high temperature superconductor composite thin film with Josephson coupled grains;

forming a device in the high temperature superconductor composite thin film; and oxygen plasma etching the high temperature superconducting composite thin film device.

2. The high temperature superconductor composite thin film device of claim 1 wherein the high temperature superconductor is selected from YBa$_2$Cu$_3$O$_7$; Bi$_2$(Ca,Sr)Cu$_2$O$_7$; La$_{2-x}$Sr$_x$CuO$_4$; TlCa$_2$Ba$_2$Cu$_3$O$_9$ and A Ba$_2$Cu$_3$O$_7$ wherein A is selected from lutetium, neodinium, samarium, europium, gadolinium, erbium, holmium, and ytterbium.

3. The high temperature superconductor composite thin film device of claim 1 wherein the insulator is selected from metal oxides that are immiscible with the high temperature superconductor.

4. The high temperature superconductor composite thin film device of claim 1 wherein the substrate is selected from SrTiO$_3$, MgO, SrLaAlO$_4$, SrLaGaO$_4$, yttria stabilized ZrO$_2$, LaAlO$_3$, NdGaO$_3$ and buffer layered Si and Al$_2$O$_3$.

5. The high temperature superconductor composite thin film device of claim 1 wherein said high temperature superconductor composite has greater than about 2% change in critical current per gauss.

6. The high temperature superconductor composite thin film device of claim 1 wherein said device is selected from fluxonic junction diodes, vortex flow transistors, Josephson effect transistors or bolometers.

7. The high temperature superconductor composite thin film device of claim 2 wherein said high temperature superconductor is YBa$_2$Cu$_3$O$_7$.

8. The high temperature superconductor composite thin film device of claim 3 wherein said insulator is selected from CeO$_2$, MgO, LaAlO$_3$ and SrTiO$_3$.

9. The high temperature superconductor composite thin film device of claim 8 wherein said insulator is CeO$_2$.

10. The high temperature superconductor composite thin film device of claim 1 wherein said oxygen treatment is a high pressure oxygen plasma etch.

11. A high temperature superconductor composite thin film device having easy vortex flow, said device being formed from the process comprising:

selecting a substrate that is compatible with YBa$_2$Cu$_3$O$_7$;

codepositing YBa$_2$Cu$_3$O$_7$ and CeO$_2$ on said substrate to form a high temperature superconducting composite thin film with Josephson coupled grains;

forming a device in the high temperature superconducting composite thin film; and plasma etching the high temperature superconducting composite thin film device.

12. The high temperature superconducting composite thin film device of claim 11 wherein said device is selected from fluxonic junction diodes, vortex flow transistors Josephson junction transistors and bolometers.

13. The high temperature superconducting composite thin film device of claim 11 wherein said substrate is selected from SrTiO$_3$, MgO, SrLaAlO$_4$, SrLaGaO$_4$, yttria stabilized ZrO$_2$, LaAlO$_3$, NdGaO$_3$ and buffered layer Si and Al$_2$O$_3$.

14. The high temperature superconducting thin film device of claim 11 wherein said oxygen treating is by high pressure oxygen plasma etch.

15. The high temperature superconducting thin film device of claim 11 wherein said high temperature superconductor composite thin film has greater than about 2% change in critical current per gauss.

16. The high temperature superconducting thin film device of claim 11 wherein the high temperature superconductor composite thin film contains up to about 43% by volume CeO$_2$.

17. The high temperature superconductor thin film device of claim 11 wherein said high temperature superconductor composite thin film contains up to about 30% by volume CeO$_2$.

18. The high temperature superconductor thin film device of claim 2 wherein said high temperature superconductor composite thin film has a $T_c$ from about 84.4K to about 16.5K.

19. The high temperature superconductor thin film device of claim 10 wherein the oxygen plasma has a pressure up to about 5 mm of Hg.

20. The high temperature superconductor composite thin film device of claim 19 wherein the oxygen plasma has a pressure from about 0.1 mm up to about 5 mm of Hg.

21. The high temperature superconductor composite thin film device of claim 14 wherein the oxygen plasma has a pressure up to about 5 mm of Hg.

22. The high temperature superconductor composite thin film device of claim 2 wherein the oxygen plasma has a pressure from about 0.1 mm up to about 5 mm of Hg.

* * * * *